US007851977B2

(12) United States Patent
Ruile et al.

(10) Patent No.: US 7,851,977 B2
(45) Date of Patent: Dec. 14, 2010

(54) ELECTROACOUSTIC COMPONENT

(75) Inventors: Werner Ruile, Munich (DE); Ulrike Roesler, Hebertshausen (DE)

(73) Assignee: EPCOS AG, Munich (DE)

( * ) Notice: Subject to any disclaimer, the term of this patent is extended or adjusted under 35 U.S.C. 154(b) by 201 days.

(21) Appl. No.: 12/093,876

(22) PCT Filed: Nov. 20, 2006

(86) PCT No.: PCT/DE2006/002029

§ 371 (c)(1),
(2), (4) Date: May 15, 2008

(87) PCT Pub. No.: WO2007/059740

PCT Pub. Date: May 31, 2007

(65) Prior Publication Data
US 2008/0252396 A1 Oct. 16, 2008

(30) Foreign Application Priority Data
Nov. 23, 2005 (DE) .................. 10 2005 055 871

(51) Int. Cl.
H01L 41/08 (2006.01)
(52) U.S. Cl. ................ 310/334; 310/313 R; 310/313 B
(58) Field of Classification Search ............ 310/313 R, 310/313 A, 313 B; 333/193–196
See application file for complete search history.

(56) References Cited

U.S. PATENT DOCUMENTS

| 4,328,472 | A | 5/1982 | Grudkowski |
| 6,046,656 | A | 4/2000 | Mishima |
| 7,151,424 | B2 * | 12/2006 | Kando ................... 333/193 |
| 7,262,676 | B2 | 8/2007 | Ruile et al. |
| 2003/0137367 | A1 * | 7/2003 | Kadota ................... 333/195 |
| 2005/0099091 | A1 | 5/2005 | Mishima et al. |
| 2005/0162048 | A1 | 7/2005 | Solal et al. |
| 2006/0076852 | A1 * | 4/2006 | Ruile et al. ............. 310/313 R |
| 2006/0290233 | A1 * | 12/2006 | Nishiyama et al. ...... 310/313 R |
| 2007/0018536 | A1 * | 1/2007 | Kadota et al. ............ 310/322 |

FOREIGN PATENT DOCUMENTS

| DE | 103 25 281 | 12/2004 |
| EP | 0 886 375 | 12/1998 |
| WO | WO01/29964 | 4/2001 |
| WO | WO03/088475 | 10/2003 |
| WO | WO03/088482 | 10/2003 |
| WO | WO2004/095699 | 11/2004 |

(Continued)

OTHER PUBLICATIONS

English translation of Written Opinion for PCT/DE2006/002029.

(Continued)

Primary Examiner—Mark Budd
(74) Attorney, Agent, or Firm—Fish & Richardson P.C.

(57) ABSTRACT

A component working with guided bulk acoustic waves includes a first substrate, a second substrate, and a layer system between the first and second substrates. The layer system includes a metal layer and a dielectric layer. A ratio of the acoustic impedance of the metal layer to the acoustic impedance of the dielectric layer is greater than or equal to 4.5.

31 Claims, 5 Drawing Sheets

FOREIGN PATENT DOCUMENTS

Figure 1D:
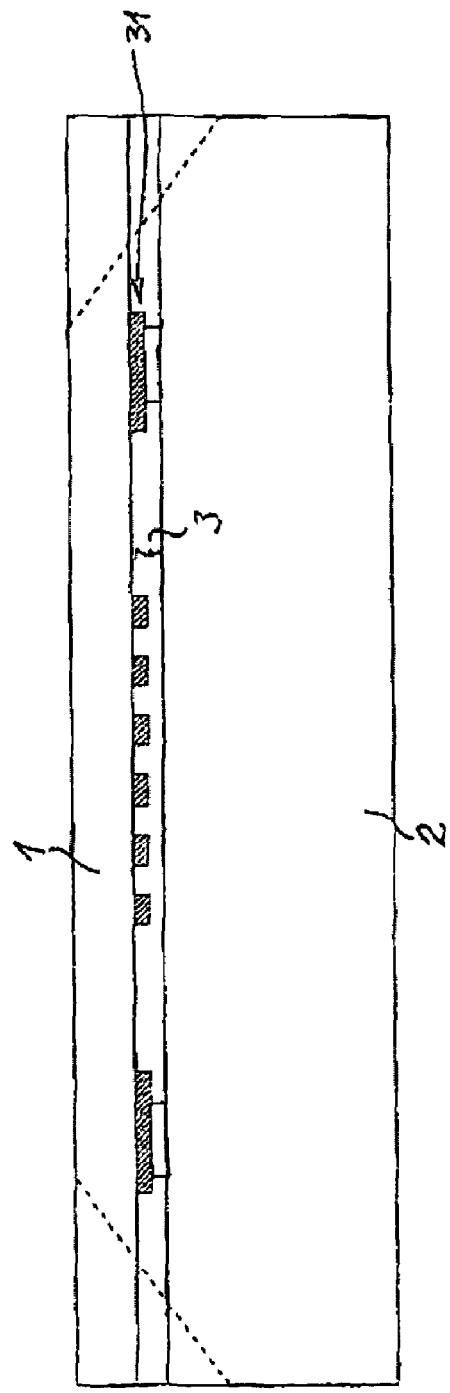
Figure 1E:
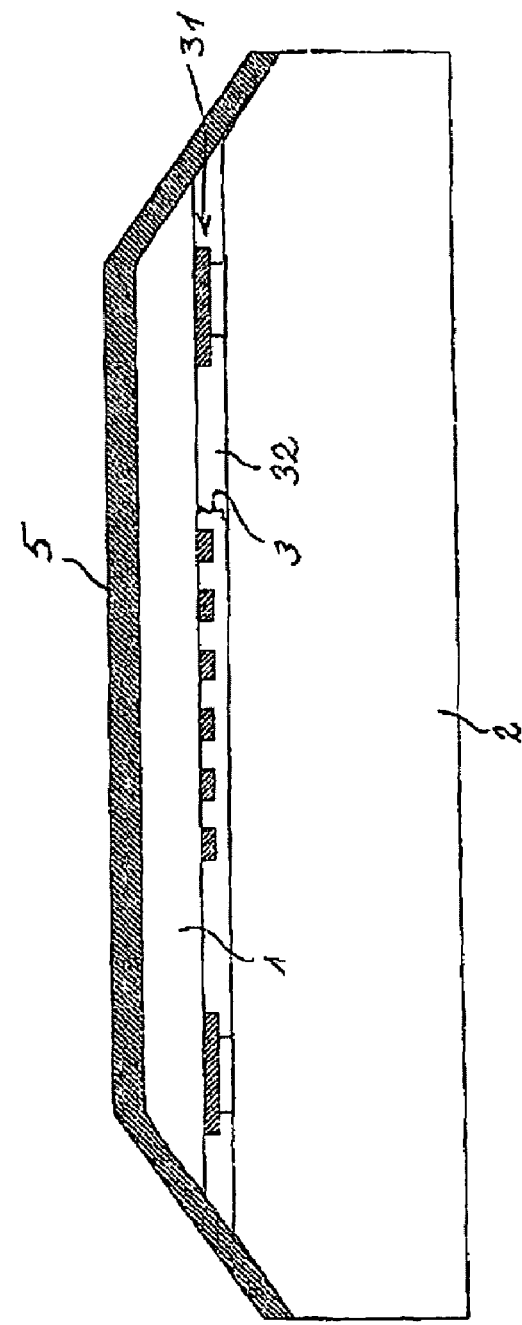

| | | |
|---|---|---|
| WO | WO2005/069486 | 7/2005 |
| WO | WO2005/083881 | 9/2005 |
| WO | WO2005/086345 | 9/2005 |
| WO | WO2005/093949 | 10/2005 |

OTHER PUBLICATIONS

Kawachi O. et al, "Optimal Cut for Leaky SAW on LiTaO3 for High Performance Resonators and Filters" IEEE Transactions on Ultrasonics, Ferroelectrics and Frequency Control, vol. 48, No. 5, Sep. 2001, pp. 1442-1448, XP-002261269.

H. Kando et al. "RF Filter Using Boundary Acoustic Wave" Murata Mfg. Co. Ltd. 2288 Oshinohara, Yasu-shi, Shiga 520-2393, Japan.

K. Yamanouchi et al. "High Temperature Stable High Electromechanical Coupling Substrates and Application for Surface Acoustic Wave Devices" Tohoku Institute of Technology, Sendai, Japan 2001 IEEE Ultrasonics Symposium, pp. 189-192.

International Search Report for PCT/DE2006/002029.

Written Opinion for PCT/DE2006/002029.

Office Action from related U.S. Appl. No. 12/093,531, dated Oct. 15, 2009.

Amendment in Reply to Action of Oct. 15, 2009 from related U.S. Appl. No. 12/093,531, dated Jan. 12, 2010.

Final Office Action from related U.S. Appl. No. 12/093,531, dated Feb. 25, 2010.

Amendment in Reply to Action of Feb. 25, 2010 from related U.S. Appl. No. 12/093,531, dated Apr. 26, 2010.

Notice of Allowance from related U.S. Appl. No. 12/093,531, dated May 6, 2010.

International Preliminary Report on Patentability from corresponding PCT application PCT/DE2006/002034, dated Jul. 8, 2008.

Written Opinion of the International Search Authority from corresponding PCT application PCT/DE2006/002034, dated May 23, 2008.

\* cited by examiner

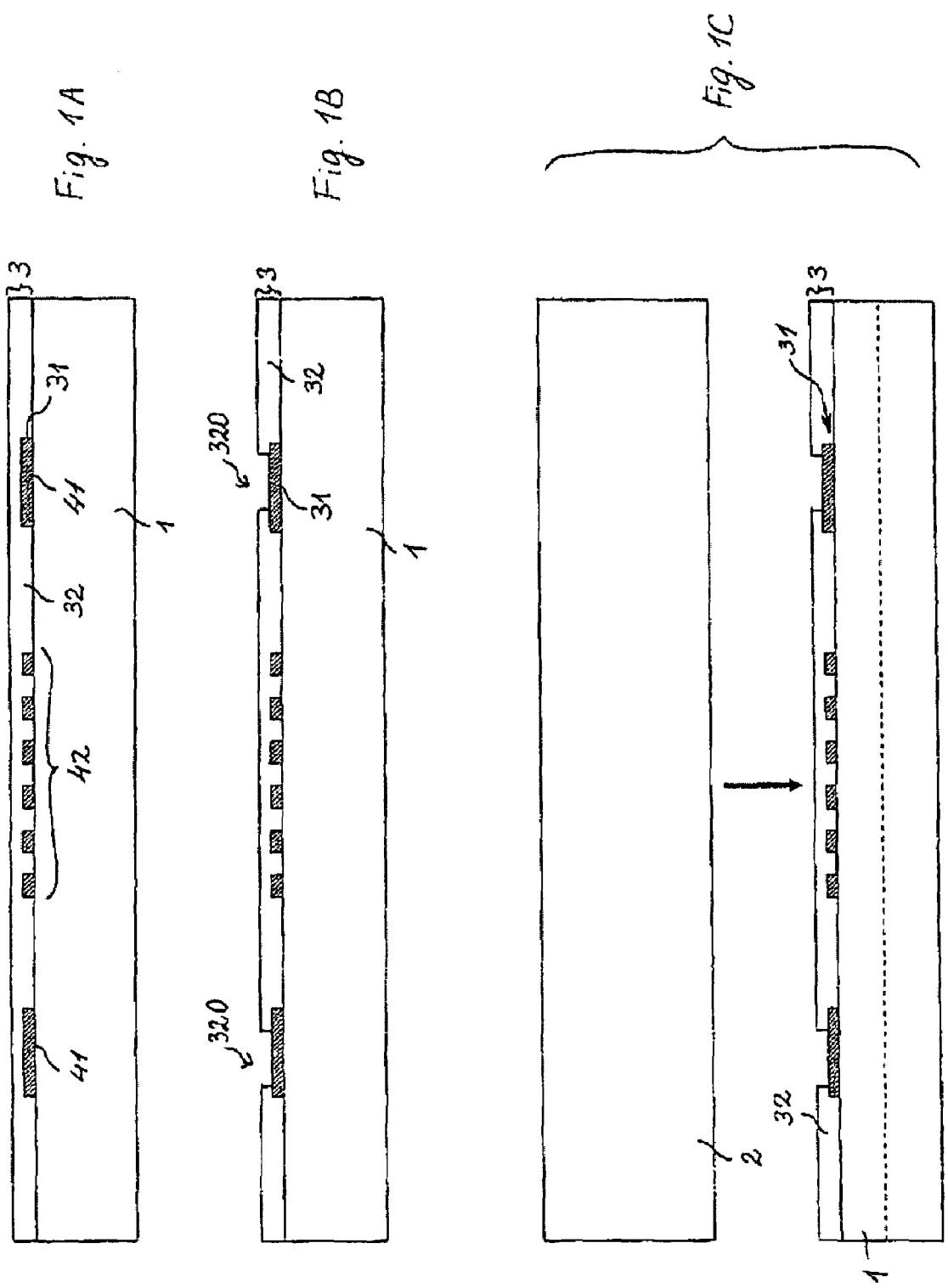

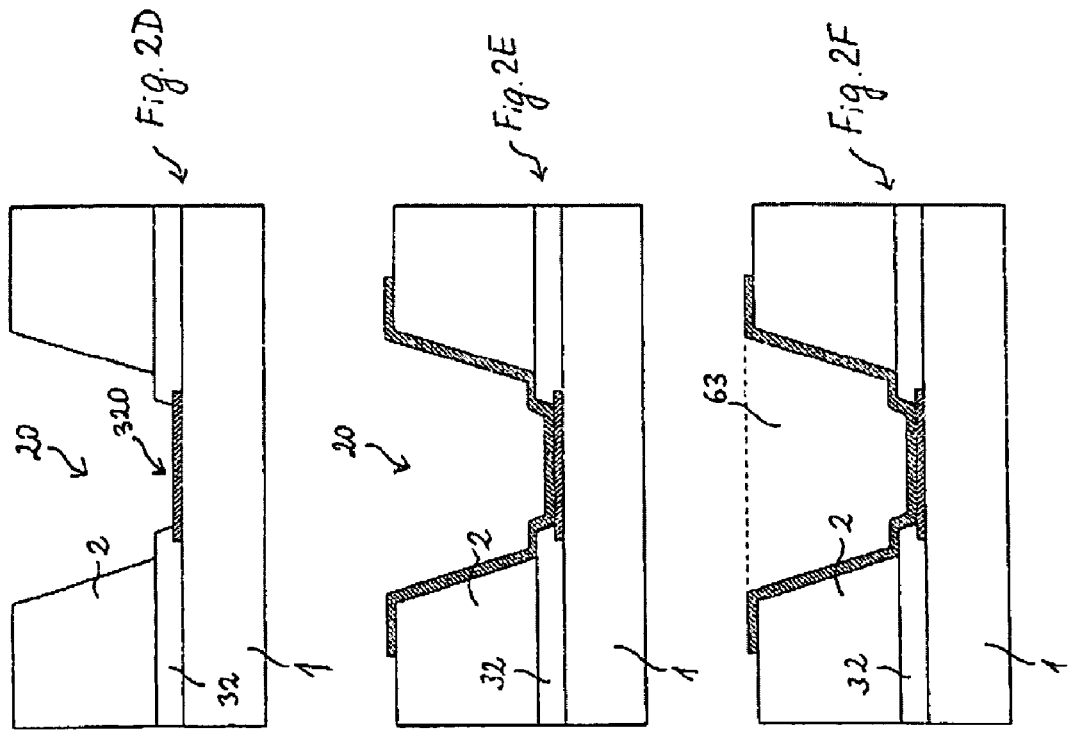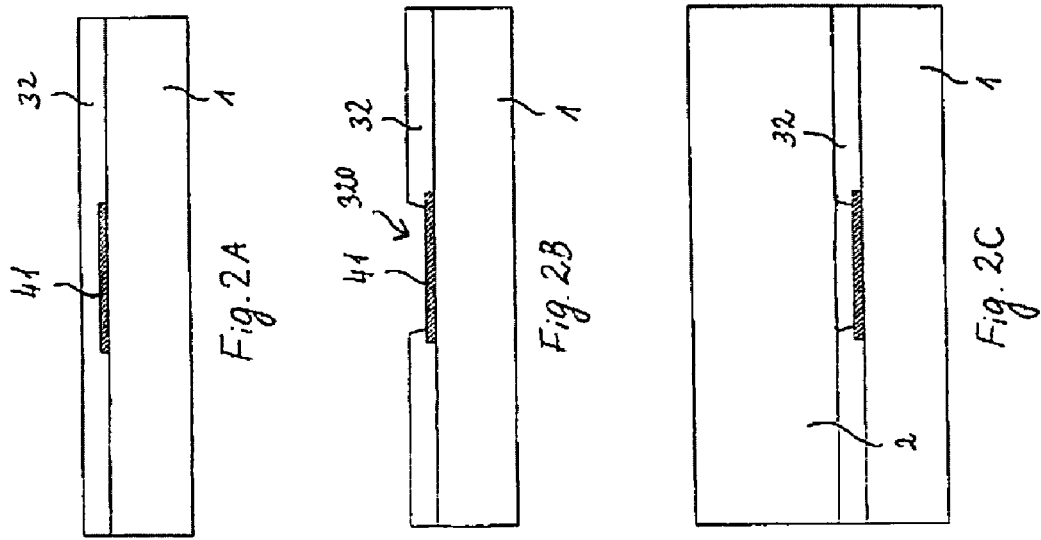

ELECTROACOUSTIC COMPONENT

CROSS REFERENCE TO RELATED APPLICATIONS

Pursuant to 35 USC §120, this application claims the benefit PCT/DE2006/002029 filed Nov. 20, 2006 which claims the benefit of German Patent Application No. 102005055871.2 filed Nov. 23, 2005. Each of these applications is incorporated by reference in its entirety.

TECHNICAL FIELD

An electroacoustic component, in particular, a component working with guided bulk waves is specified.

BACKGROUND

Components working with guided bulk waves are known, e.g., from the publications DE 10325281 A1, US 2005/0099091 A1, U.S. Pat. No. 6,046,656, WO 01/29964 A1, WO 03/088475 A1, and WO 03/088482 A1.

SUMMARY

One task to be achieved consists in specifying a robust electroacoustic component with a small base surface area.

An electroacoustic component with two substrates will be specified, between which a layer system is arranged that comprises a metal layer and a layer of low acoustic impedance $Z_{a,2}$, wherein the metal layer comprises a layer with a high acoustic impedance $Z_{a,1}$ and wherein: $Z_{a,1}/Z_{a,2} \geq 4.5$.

This metal layer comprises electroacoustically active components, primarily transducers, and contact surfaces connected conductively to these structures. A transducer has inter-meshing comb-like electrodes.

The specified impedance ratio guarantees a sufficient acoustic reflection for guided bulk acoustic waves or a sufficient acoustic stop band width at the edges of the electrodes, which are formed in the metal layer.

The ratio of acoustic impedances equals at least 5 in one advantageous variant.

The specified component preferably works with guided bulk acoustic waves (GBAW).

In addition, a component working with GBAW will be specified, which comprises a first substrate facing outward and a second substrate facing outward. Between the substrates there is a layer system, which comprises a metal layer and a dielectric layer. The thickness of the first substrate preferably equals less than ⅓ of the thickness of the second substrate.

A component working with guided bulk waves does not require tightly sealed hollow spaces for electroacoustically active component structures and is therefore particularly robust.

In addition, a component working with acoustic waves with a substrate made from $LiTaO_3$ will be specified, which has a cut angle $\phi$ rot YX, where $7°<\phi<24°$. In a preferred variant, $12°<\phi<21°$.

For electroacoustic components with $LiTaO_3$ as the substrate and such a cut angle, it is possible to achieve a high electrical bandwidth.

In one preferred embodiment, $LiTaO_3$ is used with the cut angle specified above in a component working with GBAW. The use for components working with surface waves is also taken into consideration.

Below, the specified component, its function, and preferred embodiments will be explained.

The GBAW will be excited in the layer system or at its boundary to a piezoelectric layer (i.e., to the first substrate) and guided primarily in this system. The layer system consequently comprises the metal layer, in which component structures exciting the GBAW are formed, and a dielectric layer with a low propagation velocity for acoustic waves.

The acoustic energy of a GBAW in a component working with GBAW is primarily concentrated in an area in which the wave is excited, and decays in two directions vertical to this area. This decay is achieved by a waveguide structure, i.e., by a velocity profile in the vertical direction. Here, the lowest propagation velocity is given in a preferably thin layer in the vicinity of the excitation plane of acoustic waves. This layer is arranged between layers with high acoustic propagation velocities.

An electrical signal applied to the component structures creates excursions of atoms in the piezoelectric substrate—e.g., first substrate—wherein a bulk acoustic wave, preferably a transverse wave, will be excited. The propagation velocity of this wave is preferably significantly less—e.g., by at least 10%—in the layer system, especially in the dielectric layer, than in the two substrates surrounding this layer. Thus, in the vertical direction, a velocity profile suitable for guiding waves is created, wherein a bulk wave can be guided in the horizontal plane, especially in the dielectric layer and in the vicinity of this layer.

The metal layer is preferably arranged on the (piezoelectric) first substrate. The component structures are embedded between the first substrate and the dielectric layer.

An electroacoustic transducer preferably has electrode structures with a relatively high electrical conductivity, e.g., of at least $2 \times 10^4$ $[Ohm \times cm]^{-1}$ and a comparatively high acoustic reflection.

As a highly conductive material for electrode structures, in particular aluminum comes into consideration.

The reflection coefficient $P_{11}$ at the acoustic gate of a transducer has, in a certain frequency range, a stop band, which relates to the periodic structure of the transducer. $P_{11}$ is a scattering parameter in an acoustic P-matrix model. A sufficient acoustic reflection is obtained, for example, with an acoustic stop band width of 7.5% relative to the center frequency of the transducer.

The strength of an acoustic reflection, which occurs at edges of electrode structures, depends on the acoustic impedance jump between these structures and their surroundings. The greater the impedance jump at a boundary, the stronger the acoustic reflection at this boundary. Because aluminum and silicon dioxide have similar values of acoustic impedance, the acoustic reflection at their boundary—and therefore also for electrode structures embedded in the silicon dioxide—is small due to a small acoustic impedance jump. Therefore, in the metal layer, in particular, for forming transducer electrodes, in addition to an Al layer, another sub-layer, e.g., made from W or Pt, is provided, which has a high acoustic impedance. Tungsten can have an alpha or beta configuration.

In a preferred variant, the metal layer comprises several sub-layers, among these a first sub-layer with a high acoustic impedance and a second sub-layer with a high conductivity. This has the advantage that the electrical conductivity and the acoustic reflection can be set independent of each other through material and layer thickness selection of the two sub-layers.

Sub-layers of the metal layer can be made, in principle, from metals, metal alloys, or other conductive materials.

The sub-layer with a high conductivity can be made alternatively from an Al alloy or another suitable metal.

The sub-layer with high acoustic impedance is preferably arranged directly on the piezoelectric substrate. However, in another variant it can also be spaced apart from this by a thin intermediate layer, preferably made from Ti, whose thickness advantageously does not exceed 15 nm and typically lies between 5 nm and 10 nm. For a thin intermediate layer, the sub-layer with high acoustic impedance is in the vicinity of the piezoelectric substrate. Thus high electroacoustic coupling of the component can be achieved.

This advantageously electrically conductive layer, which is arranged between the sub-layer with high acoustic impedance and the piezoelectric substrate and which is especially suitable for bonding between the substrate and the sub-layer with high acoustic impedance, is, e.g., a sub-layer of the metal layer.

The layer thickness of the layer with high acoustic impedance is selected so that the acoustic stop band width of a transducer constructed from this layer equals at least 7.5%. This thickness equals preferably between 0.02 and 0.03 wavelengths or—e.g., for a center frequency of the component of 2 GHz—between 40 and 70 nm. For components with a different center frequency, the corresponding layer thickness can be determined by gauging with the frequency.

In one variant, the layer thickness of the layer with high acoustic impedance equals between 30% and 50% of the total layer thickness of the metal layer. The thickness of the Al layer is advantageously less than $0.2\lambda$ and is selected—e.g., for a center frequency of the component of 2 GHz—between 100 and 150 nm.

In another variant, the metal layer can be made from a single layer that has high conductivity and a relatively high acoustic impedance.

In a preferred construction, the first substrate is piezoelectric. However, it is also possible for the second substrate to also have piezoelectric properties.

The first substrate is preferably cut from a single crystal. As single crystals, coming into consideration are, in particular, $LiTaO_3$, $LiNbO_3$, $ZnO$, $KNbO_3$, $NaKNbO_3$, quartz, and also other piezoelectric materials.

The first substrate, however, can also be grown as a piezoelectric layer on a growth substrate. The growth substrate is later, but not necessarily, peeled away, e.g., after connecting the first and the second substrate. As a growing piezoelectric layer, coming into consideration are, e.g., AlN, ZnO, PZT, $LiTaO_3$, $LiNbO_3$. Other piezoelectric materials that advantageously have good electroacoustic coupling are also possible.

As the material for the second substrate, coming into consideration is, in particular, high-impedance Si. The crystal orientation 111 or 110 of the Si crystal is preferred. However, $Al_2O_3$, glass, or an (organic) plastic, e.g., FR4, is also possible. Materials with a high acoustic performance are preferred here.

In one variant, the dielectric layer can be made from several sub-layers. At least one of the sub-layers can have piezoelectric properties.

The dielectric layer is made advantageously from a material whose temperature coefficient (TCF) is the opposite relative to the first and/or second substrate, wherein the temperature coefficient of the dielectric layer is negative for a positive temperature coefficient of each substrate, and vice versa. With opposing TCF for two adjacent layers it is possible to keep the temperature coefficient of the entire component small.

The dielectric layer is advantageously made from silicon dioxide. $SiO_2$ is therefore also advantageous as the material for the dielectric layer, because a $SiO_2$ surface is suitable for direct wafer bonding. As an alternative to $SiO_2$, e.g., $TeO_2$ is suitable.

The quality of the dielectric layer can be judged with respect to its optical refraction index. A dielectric layer made from $SiO_2$ with a refraction index between 1.44 and 1.48 is preferred. $SiO_2$ is advantageously stoichiometric.

A typical base surface area of the component is 500×700 $\mu m^2$. The total thickness of the component equals ca. 200 ∞m and is preferably not larger than 100 wavelengths. The total thickness of the component, however, can also be less than 200 μm.

The thickness of the first substrate is advantageously between 3 and 50 wavelengths, in a preferred variant a maximum of $30\lambda$ or 70 μm. The first substrate can be provided in a greater thickness for the deposition of additional layers of the layer sequence and can be thinned in a later processing step up to the value of the thickness named above.

The second substrate—e.g., made from Si—is advantageously significantly thicker than the first. In one variant, the thickness of the second substrate equals at least 10 wavelengths. The expansion coefficient of the second substrate is advantageously less than in the first substrate. The expansion coefficient of the second substrate can be, e.g., at least 50% less than that of the first substrate.

The layer thickness of the layer system is advantageously equal to the thickness of the dielectric layer, because the structures of the metal layer are embedded in the dielectric layer and advantageously do not project past this layer and, in one variant, equals between $00.1\lambda$ and $\lambda$, advantageously between $0.15\lambda$ and $0.5\lambda$ or between 0.3 and 1 μm. The total thickness of the second substrate and the layer system together is advantageously not greater than 100 wavelengths or 200 μm.

With the thicknesses specified above for the substrates and the layer system, it is possible to achieve a small temperature coefficient of the component, in one variant, TCF of less than −40 ppm/K. Thus, stable electrical properties of the component can be guaranteed in a wide temperature range.

The exposed (facing outward) back side of the first substrate is advantageously metalized over a large surface area. This metallization is advantageously connected to ground and is used as electromagnetic shielding for component structures. In this metallization, however, conductor tracks can also be constructed for conductive connection, e.g., between the component structures or between the encapsulated component structures and external connections. In this metallization, metal surfaces also provided as connections of the component and/or labeling of the component can also be formed.

In the second substrate, advantageously via contacts are formed, which connect connections arranged on the surface of the second substrate conductively to the contact surfaces. The via contacts can be formed as a tube (optionally with a tapering cross section) or as openings with metalized inner walls. The openings provided for via contacts in the second substrate, however, can also be filled with metal.

In the second substrate, active and/or passive circuit elements, e.g., transistors, diodes, capacitors, inductors, conductive sections, can be formed, which can be contacted from the outside by means of via contacts and which are connected to the electroacoustic component structures.

A passivation layer can be arranged on the outer conductive connections on the top side and/or bottom side of the component.

The component can be formed, in particular, as a bare die. Such a bare die can be mounted, for example, on a carrier substrate. The carrier substrate can have ceramic layers.

The specified component can be generated, for example, in a following process. A first wafer (e.g., LiTaO$_3$ wafer) is prepared that is suitable for generating first substrates of several components or component areas. A second wafer (e.g., Si wafer) is prepared that is suitable for generating second substrates. Areas of the respective substrate provided for component areas advantageously form a matrix.

On the first wafer, for each component area, advantageously photolithographic component structures—in particular, electroacoustic transducers—and contact surfaces connected conductively to these structures are generated. On the surface of the first substrate carrying the component structures, a dielectric layer is deposited, e.g., in a CVD process (CVD=Chemical Vapor Deposition) or by means of sputtering.

The dielectric layer is planarized in a preferred variant of the method, e.g., by means of a CMP method. CMP stands for Chemical Mechanical Polishing. After deposition of the dielectric layer, advantageously at least the contact surfaces are exposed, e.g., by means of etching. In one variant, electrical trimming structures are also exposed.

Electrical properties of the component structures of individual or all of the component areas are measured by the exposed contact surfaces on-wafer, before the wafer with component structures is connected to the second wafer (intermediate measurement).

The possibility exists to electrically trim the component structures of a component area on-wafer, that is, before the application of the Si wafer. In this way, trimming structures connected to the transducer advantageously as a load are provided, which have, e.g., periodic metal strips as in a transducer. The trimming structures can be constructed, in particular, as a capacitive load. For trimming, a part of these strips can be separated from the transducer. In this connection, it is preferable to expose the trimming structures after deposition of the dielectric layer. In this respect, refer to the complete contents of publication DE 10325281 A1.

It can be advantageous to expose parts of an acoustic track, such as, e.g., reflectors limiting this track or intermediate reflectors arranged between two transducers, through ablation or etching of the dielectric layer. In this way, the acoustic reflection can be increased. It is also possible to expose individual electrode strips of a transducer for increasing the reflection. It is also possible to expose a transducer and thus to save reflectors.

According to the results of the intermediate measurement, it can be advantageous to thin the dielectric layer in order, e.g., to change the frequency position of the component structures. This can be realized, e.g., by means of a CMP process. The frequency position of the component structures or the layer thickness of the dielectric layer is here set so that frequency position provided for the component results after connecting to the second wafer.

The first wafer is now connected to the second wafer, e.g., through direct wafer bonding. Wafer bonding is advantageously performed at relatively low temperatures, e.g., at room temperature. For this purpose a process known as the ziptronix process is suitable. Here, an entire wafer is generated with component areas to be divided.

The entire wafer can be thinned on the side of the first wafer. The entire wafer is cut on the side of the first substrate along separating lines, i.e., between the component areas advantageously in a V shape at least up to the second substrate. It is advantageous to also cut the second substrate up to a certain depth. Here, in particular, angled abutting edges of the first substrate and the layer system are generated, which can be metalized together with the (flat) back side of the first substrate and thus encapsulated in a hermetically tight way. Thereby, component structures are protected with respect to corrosion and also are shielded against external electromagnetic fields.

On the side of the second substrate, e.g., by etching and subsequent metallization of openings—contact holes—via contacts are generated for contacting contact surfaces. Advantageously, in the same processing step external connections of components are generated on the facing outward surface of the second wafer. The contact holes can be filled with a conductive material.

After the wafer bonding of the two wafers, a method for the quality control of electrical components can be performed. The entire wafer is arranged on a carrier—e.g., a carrier film—in such a way that connections of component areas are exposed or point upward. The carrier is advantageously an optionally elastic film, which forms a good bond with the wafer. The component areas are divided advantageously by means of sawing for forming components, without being peeled from the carrier. For the quality control of complete components, a measurement of all of the components is performed directly on the carrier. With reference to these measurement results, defective components can be sorted out or good components can be selected.

Optionally, the already divided components can be trimmed electrically again on the carrier. The possibility exists to change the encapsulated electrical trimming structures, e.g., with a laser, as already mentioned, via a transparent second substrate.

With the specified method of intermediate measurement for inspecting the electrical properties of component structures and an end measurement for quality control of prepared components, for defective components the allocation of error sources to individual processing steps is possible.

With a V-shaped cut, it is possible to shield different areas of a component, such as, e.g., its transmission area and reception area, electromagnetically from each other or to isolate them electrically and/or acoustically from each other.

In one variant of the method, the second substrate is not available as a wafer, but instead it is generated on the first wafer or on the dielectric layer as a sufficiently thick layer of, e.g., at least three wavelengths or a layer sequence with the corresponding thickness.

In one variant of the method it is possible to deposit another layer sequence on the second substrate. This layer sequence can comprise, e.g., dielectric layers and metallization layers with structured conductor tracks arranged between these dielectric layers. Integrated component structures are realized by means of conductor tracks. The additional layer sequence, however, can also comprise semiconductive layers and non-linear and/or active integrated structures, such as, e.g., diodes and transistors, constructed in these layers. In the dielectric layers, via contacts can be formed for the conductive connection of integrated component structures to external connections. The external connections are in this case arranged preferably on the surface of the layer facing outward in the additional layer sequence.

The metal layer arranged on the back side of the first substrate can be structured, e.g., for forming conductive connections, e.g., between component structures of the component.

Components working with GBAW are suitable for electrical filters, in particular, high-frequency filters. Components working with GBAW come into consideration for, among other things, arbitrary mobile radio and oscillator applications.

In principle, all of the filter technologies known for use with surface acoustic waves can also be applied to components working with GBAW. Coming into consideration are, in particular, DMS filters, ladder and lattice-type filters, one-gate and multi-gate resonators.

Below, the component and the method for its production will be explained with reference to schematic figures that are not true to scale. Shown are:

DESCRPTION OF THE DRAWINGS

Figure 3B:
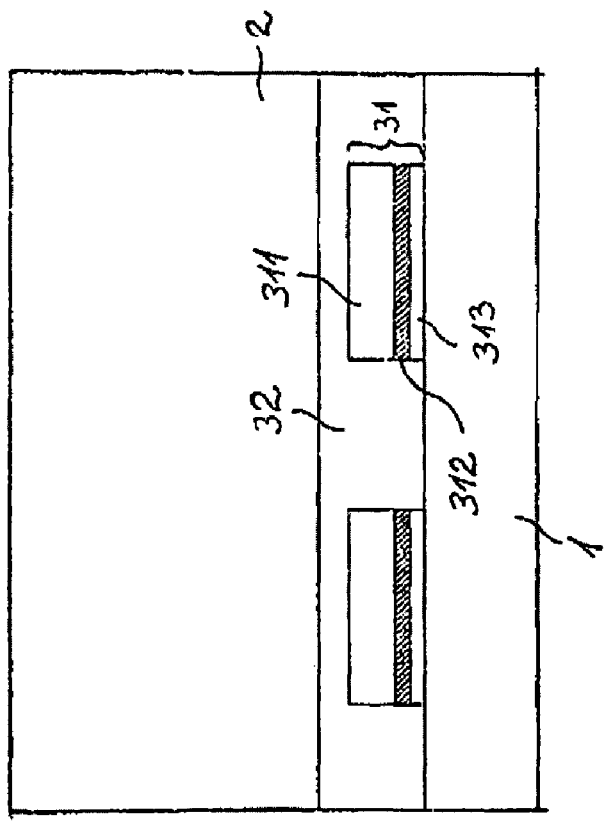
Figure 3A:
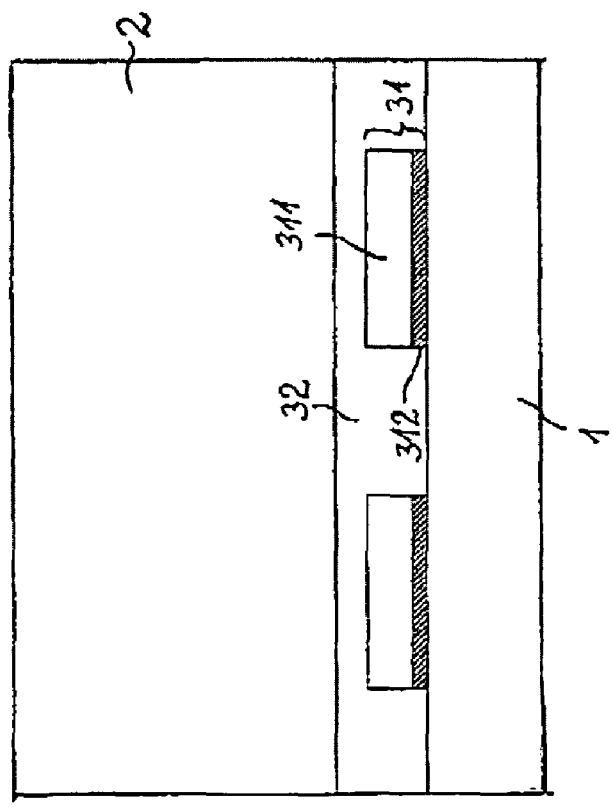

FIGS. 1A to 1G, processing steps of the production method,

FIGS. 2A to 2F, processing steps for exposing and contacting contact surfaces of the layer system, FIGS. 3A, 3B, sectioned examples for forming a metal layer, which has a sub-layer with high acoustic impedance.

DETAILED DESCRIPTION

Figure 1F:
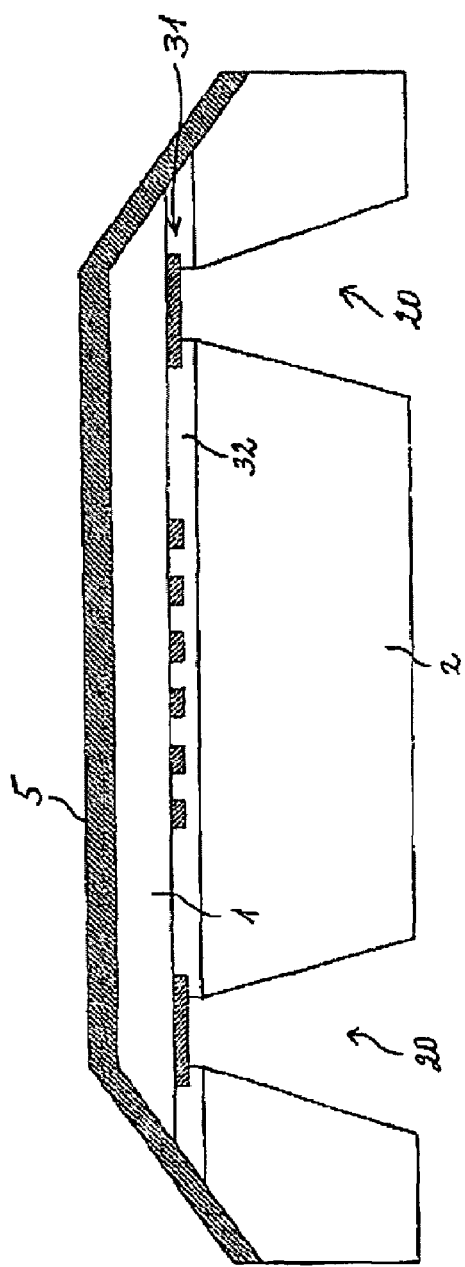
Figure 1G:
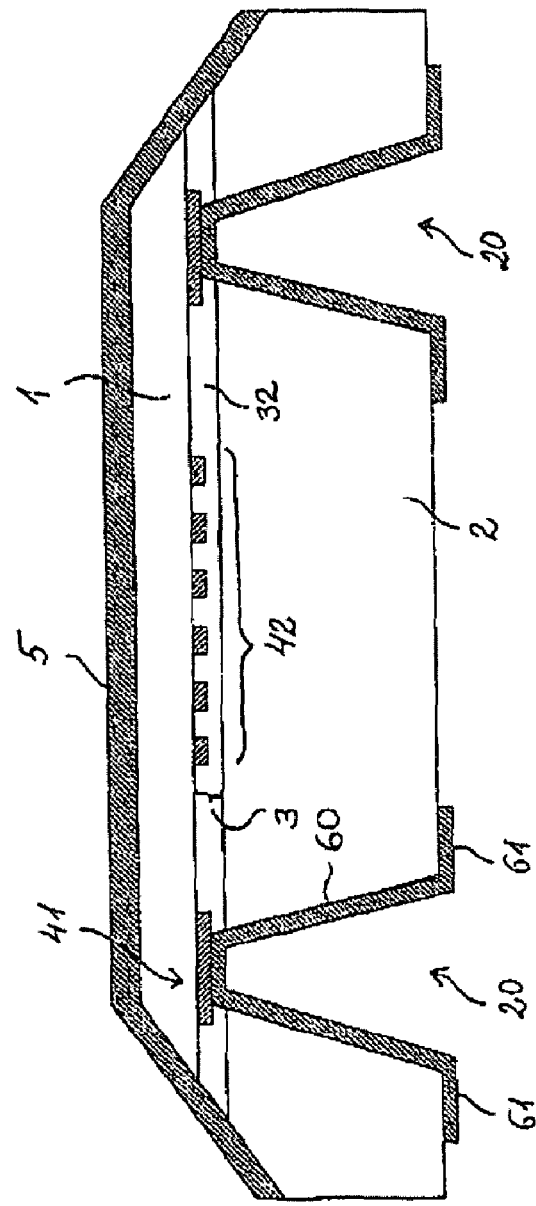

A component working with GBAW is shown in FIG. 1G. A layer system 3 is arranged between a piezoelectric first substrate 1 and a significantly thicker second substrate 2. The second substrate is advantageously a carrier substrate due to its greater thickness. In view of the minimal thickness of the first substrate, the thickness of the second substrate is advantageously selected so large that this is sufficient for the mechanical stability of the component.

The second substrate advantageously has a smaller thermal expansion than the first substrate.

In one variant, the thickness of the first and the second substrate equals 50 μm and 150 μm, respectively. In one variant, the thickness of the layer system equals 0.6 μm.

The layer system 3 comprises a metal layer 31, which is arranged on the first substrate 1 (viewed downward from above) and whose example construction is presented in detail in FIGS. 3A and 3B. The metal layer 31 is structured and includes electroacoustically active component structures 42, e.g., transducers, and contact surfaces 41 connected conductively to these structures. The structures 41, 42 of the metal layer 31 are encapsulated between the first substrate 1 and a dielectric layer 32, e.g., made from $SiO_2$.

The first substrate 1 is advantageously piezoelectric, e.g., made from $LiTaO_3$, in one variant $LiTaO_3$ 15 rotYX or 20 rot YX. The second substrate is advantageously made from a high-impedance silicon. The acoustic velocity is significantly higher in the substrates 1, 2—e.g., by at least 20%—than in the dielectric layer.

In connection with the second substrate 2 and the dielectric layer 32, contact holes 20 for exposing contact surfaces 41 are provided. In the region of the contact holes there is a metallization layer 60, which covers the inner walls of contact holes and the exposed areas of the contact surfaces. The metallization layer 60 is also arranged partially on the bottom side of the second substrate 2 and forms external connections 61.

In FIG. 1A, a first wafer is shown. For the production of the first wafer, a structured metal layer 31 is first deposited on a first substrate 1. A dielectric layer is deposited on the first substrate 1 with the metal layer 31.

The dielectric layer 32 is advantageously planarized. In the next step (FIG. 1B), areas 320 of the dielectric layer 32 are etched in order to at least partially expose, in particular, contact surfaces 41. In this way it is possible to measure electrical parameters of the component areas. If the actual values of these parameters deviate from desired values, the layer system can be trimmed at this stage, on one hand, electrically and, on the other hand, mechanically. For electrical trimming, e.g., here not-shown trimming structures and thus the electrical impedance of component structures are changed. For mechanical trimming, the dielectric layer can be thinned.

As the next step, the first wafer 1, 3 will be connected to a second wafer or second substrate 2, advantageously by means of direct wafer bonding (FIG. 1C). In FIG. 1C it is indicated with a dashed line that the first substrate is thinned.

By thinning the first substrate, which has, as a rule, a higher thermal expansion than the second substrate, the thermal expansion of the total component will be improved, just like the temperature coefficient in the case of the combination of substrates made from Si and $LiTaO_3$.

The representation according to FIGS. 1A to 1C is rotated by 180° relative to the representation according to FIGS. 1D to 1G, so that in FIGS. 1D to 1G, the second substrate 2 is facing downward and the first substrate 1 is facing upward.

In FIG. 1D, the first substrate 1 has already been thinned. In FIG. 1D it is indicated with dashed lines that abutting edges of the first substrate, the layer system 3, and partially also abutting edges of the second substrate are beveled, e.g., by a V-shaped cut between two component areas.

The back side of the first substrate and, in particular, also the interface still exposed in FIG. 1D between the layer system 3 and the substrates 1, 2 will be metalized (metal layer 5 in FIG. 1E) and thus sealed against harmful environmental influences.

In the second substrate 2, contact holes 20 are generated advantageously with angled walls (FIG. 1F). The contact holes 20 here open up into the openings 320 of the dielectric layer. In this way, contact surfaces are exposed again. A metallization layer 60, 61 is deposited on parts of the surface of the second substrate, on the inner walls of the contact holes 20, and on the exposed areas of the contact surfaces 41.

In FIGS. 2A to 2F, processing steps for forming via contacts for contacting contact surfaces 41 are explained. FIG. 2A is a section from FIG. 1A. In FIG. 2B, it is shown that advantageously not the entire contact surface 41, but instead only a part of it is exposed. In the dielectric layer 32, an opening 320 is etched advantageously with angled walls. In this way, trimming structures and/or parts of component structures can be exposed. FIG. 2C shows in section the entire wafer after connecting the two wafers.

In the second wafer, contact holes 20 are generated, whose smallest cross-sectional size is advantageously greater than the greatest cross-sectional size of the opening 320. In this way, a contact hole with a step in its cross section is generated. This hole is now metalized (FIG. 2E). In FIG. 2F, it is indicated that the metalized contact holes can be filled with a conductive material 63.

In FIG. 3A, one variant is shown in which the layer with high acoustic impedance 312, e.g., made from tungsten, is arranged directly on the first substrate 1. The layer 311 with high conductivity is advantageously made from aluminum.

The layer thickness of the layer 312 usually having a lower conductivity is advantageously significantly smaller than the layer thickness of the highly conductive layer 311 (e.g., one third, e.g., for 2 GHz W layer 50 nm or Al layer 150 nm).

In the variant according to FIG. 3B, an additional conductive layer 313, which is made, e.g., from titanium, and which is used as a bonding layer advantageously for the layer 312, is provided between the layer 312 with high acoustic impedance. The layer 313 is advantageously not thicker than 10 nm.

In addition, the metal layer 31 can advantageously include a passivation layer not shown here as the uppermost sub-layer.

The invention claimed is:

1. A component working with guided bulk acoustic waves, the component comprising:
   a first substrate;
   a second substrates; and
   a layer system between the first and second substrates, the layer system comprising;
      a metal layer comprising a layer with a relatively high acoustic impedance; and
   a dielectric layer having a relatively low acoustic impedance;
   wherein:
      a ratio of the acoustic impedance of the layer with a relatively high acoustic impedance of the metal layer to the acoustic impedance of the dielectric layer is greater than or equal to 4.5;
      the metal layer includes a sub-layer with a conductivity of at least $9\times10^4[\Omega cm]^{-1}$; and
      the sub-layer comprises Al.

2. The component of claim 1, wherein the first substrate has piezoelectric properties.

3. The component of claim 1, wherein the layer of the metal layer with high acoustic impedance is facing the first substrate.

4. The component of claim 1, further comprising an intermediate layer having a thickness of less than 10 nm between the first substrate and the metal layer.

5. The component of claim 4, wherein the intermediate layer comprises an adhesion promoting layer.

6. The component of claim 1, wherein the dielectric layer comprises silicon dioxide.

7. The component of claim 1, wherein the layer of the metal layer with high acoustic impedance comprises tungsten.

8. The component of claim 1, wherein the layer of the metal layer with high acoustic impedance comprises platinum.

9. The component of claim 1, wherein a layer thickness of the layer of the metal layer with high acoustic impedance is between 30% and 50% of a total layer thickness of the metal layer.

10. The component of claim 1, further comprising a transducer in the metal layer, the transducer being configured to operate at a center frequency, wherein the layer thickness of the layer of the metal layer with high acoustic impedance is configured such that the stop band width of the acoustic reflection coefficient of the transducer is at least 7.6% relative to the center frequency.

11. The component of claim 10, wherein the layer thickness of the layer of the metal layer with high acoustic impedance is between $0.02\lambda$ and $0.03\lambda$.

12. The component of claim 1, wherein the first substrate comprises $LiTaO_3$.

13. The component according of claim 12, wherein the first substrate has an cut angle $\phi$ rot YX, where $7°<\phi<24°$.

14. A component for working with guided bulk acoustic waves, comprising;
   a first substrate facing outward;
   a second substrate facing outward; and
   a layer system between the first and second substrates, the layer system comprising a metal layer and a dielectric layer,
   wherein:
   a thickness of the first substrate is at most, 50% of a thickness of the second substrate;
   the metal layer includes a sub-layer with a conductivity of at least $9\times10^4[\Omega cm]^{-1}$; and
   the sub-layer comprises Al.

15. The component of claim 1, wherein a thickness of the first substrate is at most 50% of a thickness of the second substrate.

16. The component of claim 1, wherein a thickness of the first substrate is at most ⅓ of a thickness of the second substrate.

17. The component of claim 1, further comprising transducers and contact surfaces in the metal layer.

18. The component of claim 1, wherein the metal layer is directly on the first substrate.

19. The component of claim 17, wherein the dielectric layer is configured to seal electrode structures of the transducers against the first substrate.

20. The component of claim 1, wherein the second substrate comprises high resistive silicon.

21. The component claim 17 further comprising via contacts in the second substrate for contacting the contact surfaces.

22. The component of claim 1, wherein abutting edges of the first substrate and the layer system are beveled.

23. The component of claim 22, wherein at least a portion of an abutting edge of the second substrate is beveled.

24. The component of claim 23, further comprising a second metal layer on an exposed surface of the first substrate and on the beveled abutting edges.

25. The component of claim 24, wherein the second metal layer covers the abutting edges of the first substrate and the layer system and terminates at the second substrate.

26. The component of claim 1, wherein the a thickness of the first substrate is between $3\lambda$ and $50\lambda$.

27. The component of claim 1, wherein a total thickness of the second substrate and the layer system is less than or equal to $100\lambda$.

28. The component of claim 1, wherein a layer thickness of the dielectric layer is between $0.1\lambda$ and $\lambda$.

29. The component of claim 1, wherein the dielectric layer has an opposite temperature coefficient relative to one or both of the first substrate and the second substrate.

30. The component of claim 1, wherein the propagation velocity of a bulk wave in the layer system is at most 90% of the propagation velocity of a bulk wave in the first and second substrates.

31. The component of claim 1, wherein the propagation velocity of a bulk wave in the first substrate is less than the propagation velocity of a bulk wave in the second substrate.

* * * * *

UNITED STATES PATENT AND TRADEMARK OFFICE
CERTIFICATE OF CORRECTION

PATENT NO. : 7,851,977 B2
APPLICATION NO. : 12/093876
DATED : December 14, 2010
INVENTOR(S) : Werner Ruile and Ulrike Roesler It is certified that error appears in the above-identified patent and that said Letters Patent is hereby corrected as shown below:

Claim 1, Column 9, Line 5 – delete "substrates;" and insert -- substrate; --, therefor.

Claim 7, Column 9, Line 31 – delete "claim 1,wherein;" and insert -- claim 1, wherein --, therefor.

Claim 12, Column 9, Line 49 – delete "claim 1,wherein;" and insert -- claim 1, wherein --, therefor.

Claim 21, Column 10, Line 25 – delete "component claim" and insert -- component of claim --, therefor.

Claim 26, Column 10, Line 38 – delete "the a" and insert -- a --, therefor.

Signed and Sealed this
Fifteenth Day of March, 2011

David J. Kappos
*Director of the United States Patent and Trademark Office*